(12) United States Patent
Wang et al.

(10) Patent No.: US 9,728,934 B2
(45) Date of Patent: Aug. 8, 2017

(54) BACK-SIDE-EMITTING VERTICAL CAVITY SURFACE EMITTING LASER (VCSEL) WAFER BONDED TO A HEAT-DISSIPATION WAFER, DEVICES AND METHODS

(71) Applicant: Avago Technologies General IP (Singapore) Pte. Ltd., Singapore (SG)

(72) Inventors: Tak Kui Wang, San Jose, CA (US); Chung-Yi Su, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 25 days.

(21) Appl. No.: 14/841,569

(22) Filed: Aug. 31, 2015

(65) Prior Publication Data

US 2017/0063035 A1    Mar. 2, 2017

(51) Int. Cl.
*H01S 3/04*    (2006.01)
*H01S 5/00*    (2006.01)
(Continued)

(52) U.S. Cl.
CPC .......... *H01S 5/0206* (2013.01); *H01S 5/0201* (2013.01); *H01S 5/0215* (2013.01);
(Continued)

(58) Field of Classification Search
CPC ............. H01S 5/02469; H01S 5/18352; H01S 5/0215; H01S 5/423; H01S 5/18369;
(Continued)

(56) References Cited

U.S. PATENT DOCUMENTS 4,615,766 A * 10/1986 Jackson ................ H01L 21/314
                                                    148/DIG. 84
6,174,749 B1 * 1/2001 Yuen ..................... H01S 5/18358
                                                    257/E33.069
(Continued)

FOREIGN PATENT DOCUMENTS

DE     102014200583 B3    5/2015
JP       EP 0590232 A1 *  4/1994  ........... H01S 5/4031

OTHER PUBLICATIONS

Ji Fan and Chuan Seng Tan, Low temperature wafer-level metal thermo-compression bonding technology for 3D integration, Metallurgy—Advances in Materials and Processes, Sep. 19, 2012, pp. 71-94, Chapter 4, Intech, http://dx.doi.org/10.5772/48216.

*Primary Examiner* — Yuanda Zhang (57) ABSTRACT

A wafer-to-wafer bonded arrangement is provided comprising a VCSEL wafer and a highly thermally-conductive (HTC) wafer that are bonded together with the front side of the VCSEL wafer bonded to the HTC wafer. The VCSEL wafer is fabricated to include, at least initially, a native substrate. The HTC wafer includes a thermally-conductive, non-native substrate. All or a portion of the native substrate may be removed after performing wafer-to-wafer bonding. In effect, the HTC wafer becomes the substrate of the bonded pair. During operation of VCSEL dies diced from the bonded wafer, heat generated by the dies flows into the non-native substrate where the heat spreads out and is dissipated. Laser light generated by the VCSEL die is emitted through the back side of the VCSEL die.

35 Claims, 6 Drawing Sheets

(51) Int. Cl.
*H01S 5/02* (2006.01)
*H01S 5/183* (2006.01)
*H01S 5/42* (2006.01)
*H01S 5/0625* (2006.01)
*H01S 5/024* (2006.01)
*H01S 5/20* (2006.01)

(52) U.S. Cl.
CPC ........ *H01S 5/0216* (2013.01); *H01S 5/06256* (2013.01); *H01S 5/18305* (2013.01); *H01S 5/18352* (2013.01); *H01S 5/423* (2013.01); H01S 5/0203 (2013.01); H01S 5/0217 (2013.01); H01S 5/02476 (2013.01); H01S 5/18308 (2013.01); H01S 5/18369 (2013.01); H01S 5/18377 (2013.01); H01S 5/2063 (2013.01)

(58) Field of Classification Search
CPC .. H01S 5/0206; H01S 5/06256; H01S 5/0201; H01S 5/187; H01S 5/18305
See application file for complete search history.

(56) References Cited

U.S. PATENT DOCUMENTS

| | | | |
|---|---|---|---|
| 6,562,648 B1* | 5/2003 | Wong | H01L 21/2007 257/E21.122 |
| 6,735,230 B1* | 5/2004 | Tanabe | B82Y 20/00 372/43.01 |
| 8,189,642 B1* | 5/2012 | Li | H01S 5/18352 372/46.013 |
| 8,889,441 B2 | 11/2014 | Takai et al. | |
| 2009/0003401 A1* | 1/2009 | Sekiguchi | H01S 5/18394 372/50.124 |
| 2014/0151866 A1* | 6/2014 | Otremba | H01L 23/293 257/676 |
| 2015/0255955 A1* | 9/2015 | Wang | H01S 5/0224 438/29 |
| 2016/0240999 A1* | 8/2016 | Barbarossa | H01S 5/02236 |

\* cited by examiner

BACK-SIDE-EMITTING VERTICAL CAVITY SURFACE EMITTING LASER (VCSEL) WAFER BONDED TO A HEAT-DISSIPATION WAFER, DEVICES AND METHODS

TECHNICAL FIELD OF THE INVENTION

The invention relates to vertical cavity surface emitting lasers (VCSELs). More particularly, the invention relates to a back-side-emitting VCSEL wafer bonded to a heat-dissipation wafer.

BACKGROUND OF THE INVENTION

VCSELs are widely used as light sources for optical interconnect devices, storage area networks, and sensors. The most common configuration of a VCSEL is a two-terminal VCSEL that includes a conducting n-type substrate, an n-type distributed Brag reflector (DBR) disposed on the top surface of the substrate, an intrinsic layer (active region) disposed on top of n-type DBR, a p-type DBR disposed on top of the intrinsic layer, an ohmic n-contact disposed on the bottom surface of the n-type substrate, and an ohmic p-contact disposed on the top surface of the p-type DBR. The ohmic n- and p-contacts correspond to respective first and second terminals of the VCSEL.

When an electric potential is applied across the terminals, electrons from the n-type layers that are adjacent the intrinsic layer and holes from the p-type layers that are adjacent the intrinsic layer are injected into the active region of the intrinsic layer where they combine to produce photons. This combining of holes and electrons in the active region to produce photons is a phenomenon known as spontaneous emission. As the photons pass out of the active region, they are repeatedly reflected by the DBRs back into the active region, which results in more recombination of electrons and holes in the active region. This is a phenomenon known as stimulated emission. The repeated reflection of photons by the DBRs back into the active region provides the "pumping" action that leads to lasing.

In such VCSELs, the front, or active, side of the VCSEL is the side of the p-type DBR on which a ring-shaped ohmic p-contact is disposed and the back side of the VCSEL is the bottom surface of the substrate. These contacts are typically created by depositing several thin metal layers on the surface of the p-type DBR and the substrate. The art of selecting the appropriate metal and subsequence processing required to form the ohmic contact is well known. The laser light propagates out of the VCSEL through the top surface of the p-type DBR through an aperture defined by the shape of the ohmic p-contact. Energy supplied to the VCSEL that is not converted into light is dissipated as heat.

In a high-power VCSEL, in order to deliver maximum power in the smallest possible chip area, either a single VCSEL aperture of very large diameter or an array of many VCSEL apertures located in close proximity to one another within a single die is employed. Such a high power configuration means that heat dissipation is concentrated in a small area. Therefore, there is a need to spread out the dissipated heat to prevent the temperatures of the VCSELs from rising to the point that their performance is adversely affected. One way to provide such a highly thermally-conductive path is to replace the ring-shaped front-side (the side on which the ohmic p-contacts are disposed in the common VCSEL configuration described above) metal contact with a disk shape metal contact with no opening, and to attach the front-side of this metal contact to a substrate that is more thermally conductive than the native substrate on which the VCSEL is formed.

The attachment is accomplished using one of a plurality of known wafer-to-wafer bonding techniques. Such bonding techniques result in the metal layer that is used to form the ohmic p-contacts of the VCSEL being in contact with the thermally-conductive substrate. The highly thermally conductive substrate is used as a support to process the bonded wafer. The completed VCSEL die, after singulation from the wafer, is attached to an assembly with the thermally-conductive substrate in direct contact with a heat sink of the assembly. Heat generated in the active region of the VCSEL spreads into a larger area in the thermally-conductive substrate at a much shorter distance than a path through the native substrate of lower thermal conductivity. The overall thermal resistance of the path from the active region of the VCSEL to the heat sink of the assembly is much lower than that of a path that includes the native substrate in direct contact with the heat sink of the assembly.

One of the problems with this type of wafer-to-wafer bonded arrangement is that interfacial stress at the bonding interface can lead to bonding failure between the VCSEL wafer and the heat-dissipating wafer. For example, stress due to the different coefficients of thermal expansion (CTEs) of the VCSEL wafer and of the thermally-conductive wafer can lead to bonding failure. In addition, particles trapped between the wafers can create bonding failures. Moreover, the active side of the VCSEL wafer is typically covered with a nitride layer in which holes are etched and into which the ohmic p-contact metal is evaporated. The shapes of the holes in the nitride layer are transferred to the p-contact metal layer. These holes can create bonding voids that impede heat flow.

Another problem is that, since the contiguous metal coverage of the front-side of the aperture needed to achieve low thermal resistance blocks light emission from the front-side, light must exit the VCSEL from the back side. However, a VCSEL operating at a wavelength that is shorter than the absorbing threshold of the native substrate cannot emit light from the back-side with the native substrate in place.

Accordingly, a need exists for a wafer-to-wafer bonding solution that reduces the likelihood that a wafer-to-wafer bonding failure will occur and that improves heat flow from the VCSEL to the heat sink of the VCSEL assembly. A need also exists for a back-side-emitting VCSEL wafer bonded to a highly thermally-conductive wafer and having the native substrate of the VCSEL wafer removed.

WRITTEN DESCRIPTION

The invention is directed to a wafer-to-wafer bonded arrangement comprising a VCSEL wafer and a highly thermally-conductive (HTC) wafer that are bonded together with the front side of the VCSEL wafer bonded to the HTC wafer. The VCSEL wafer is fabricated to include, at least initially, a substrate, referred to herein as the native substrate. All or a portion of the native substrate may be removed after performing wafer-to-wafer bonding. The HTC wafer includes a thermally-conductive, non-native substrate. In effect, the HTC wafer becomes the substrate of the bonded pair. During operation of VCSEL dies diced from the bonded wafer, heat generated by the dies flows into the non-native substrate where the heat spreads out and is dissipated. Laser light generated by the VCSEL die is emitted through the back side of the VCSEL die.

In accordance with an illustrative embodiment, the native substrate has a thermal conductivity that is lower than the thermal conductivity of the HTC wafer, referred to herein as the non-native substrate. Because of the higher thermal conductivity of the non-native substrate relative to the thermal conductivity of the native substrate, temperature rise due to heat generated by the VCSEL dies flows into the non-native substrate where it spreads out and is dissipated will be lower.

In accordance with an illustrative embodiment, the non-native substrate is made of a material that is electrically conductive. Making the non-native substrate out of a material that is electrically conductive allows an electrical connection to be made to the p-side of the VCSEL die by mounting the VCSEL die on an electrically-conductive contact pad of a circuit carrier, such as a printed circuit board (PCB), for example. In such cases, the electrically-conductive non-native substrate electrically couples the electrical contact pad of the circuit carrier with the p-contact metal layer of the p-side of the VCSEL die. In cases where the non-native material is not made of an electrically-conductive material, the electrical connection to the p-side of the VCSEL die can be made through openings, or vias, formed in the epitaxial structure or in the non-native substrate, or by disposing a conductive layer between the VCSEL wafer and the non-native substrate. In the latter case, part of the native substrate and the epi layer can be partially or completely removed to access this conductive layer.

In accordance with an illustrative embodiment, the native substrate and the non-native substrate have coefficients of thermal expansion (CTEs) that are closely matched. Closely matching the CTEs of the native and non-native substrates reduces warping of the bonded wafer. Furthermore, different CTEs can induce interfacial stress at the bonding interface of the wafers, which increases the likelihood of a bonding failure. Closely matching the CTEs of the native and non-native substrates reduces interfacial stress, thereby reducing the likelihood of a bonding failure.

In accordance with another illustrative embodiment, trenches are etched into the active side of the VCSEL wafer. The trenches reduce the wafer-to-wafer contact area, which reduces the number of particulates that may be trapped between the bonded areas. Consequently, the likelihood that a bonding failure will occur due to particulates being trapped in between the bonded areas of the wafers is reduced. The trenches also provide strain relief to the VCSEL wafer that reduces the likelihood of the VCSEL wafer becoming warped, which can also lead to bonding failure. The trenches can also act as reservoirs to accommodate material that can be squeezed out of the bonded wafer areas in cases in which a meltable or adhesive material is used for the bonding. An example of a meltable material is solder. An example of an adhesive material is epoxy.

In accordance with another illustrative embodiment, all of the native substrate is removed after wafer-to-wafer bonding has been performed. Prior to performing the wafer-to-wafer bonding process, trenches are formed around the periphery of each VCSEL die of the VCSEL wafer and through the entire epitaxial (epi) structure of the VCSEL wafer. Once the native substrate has been removed, the trenches become visible from the back side (i.e., the n side) of the VCSEL wafer by an optical image capturing device (e.g., a camera). These visible trenches in the epi structure can be used as alignment features for further processing of the back side of the VCSEL wafer (e.g., forming the n-type contacts).

In accordance with another illustrative embodiment, a mesa is formed in the p-type DBR of each VCSEL die without compromising the planarity of the portions of the p-contact metal layer on top of the mesas that are bonded to the non-native substrate of the HTC wafer. The mesas provide deeper implantation for current isolation. The mesas also provide improved refractive index light guiding, particularly in regard to VCSELs having smaller apertures.

These and other features and advantages will now be described with reference to FIGS. 1A-3D, in which like reference numerals are used to represent like elements, features or components. It should be noted that elements, features or components in the figures are not necessarily drawn to scale, emphasis instead being placed on demonstrating principles and concepts of the invention.

Figure 1A:
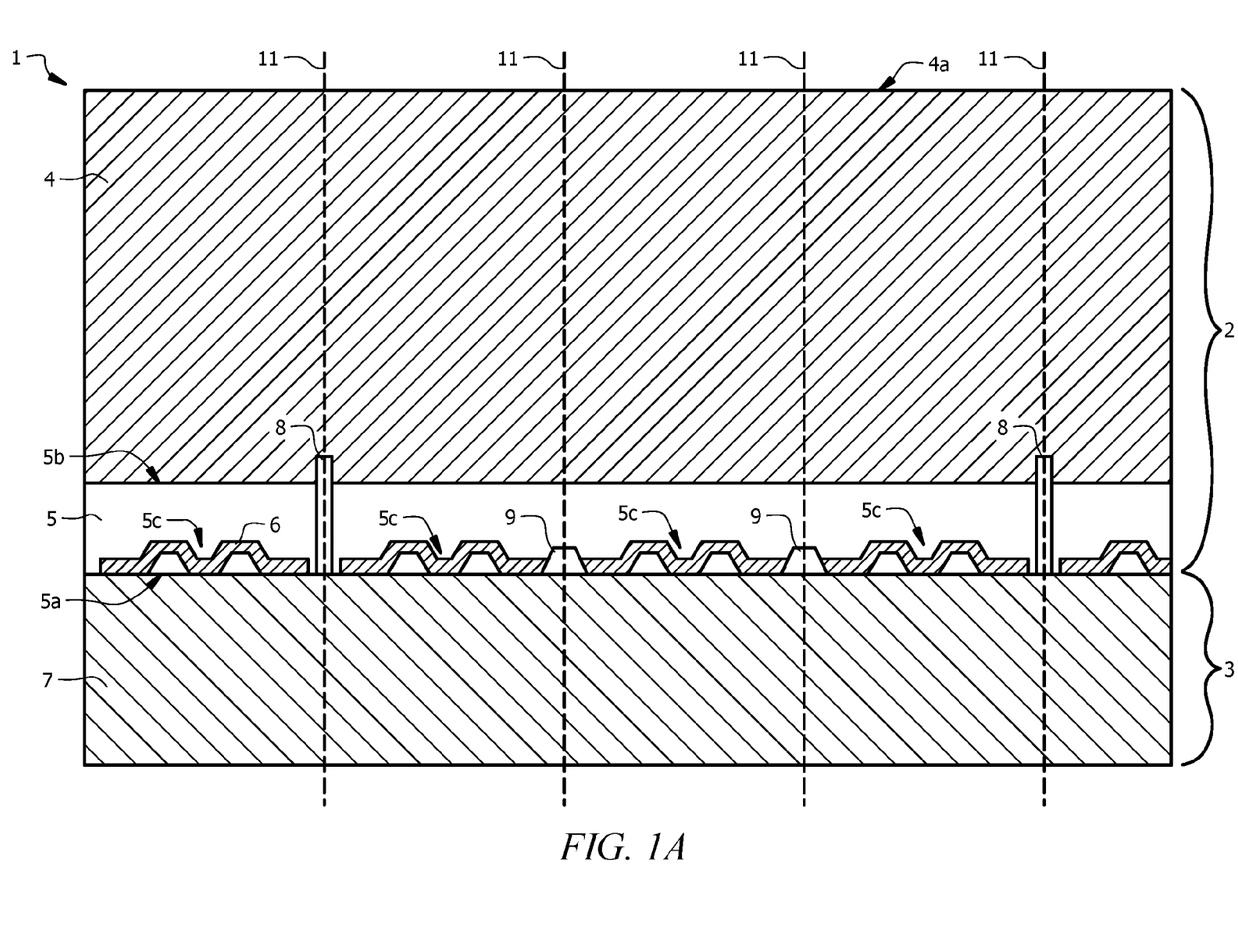
FIG. 1A illustrates a side cross-sectional view of a wafer-to-wafer bonded arrangement comprising a back-side-emitting VCSEL wafer bonded to a wafer of highly thermally-conductive (HTC) material in accordance with an illustrative embodiment.
Figure 1B:
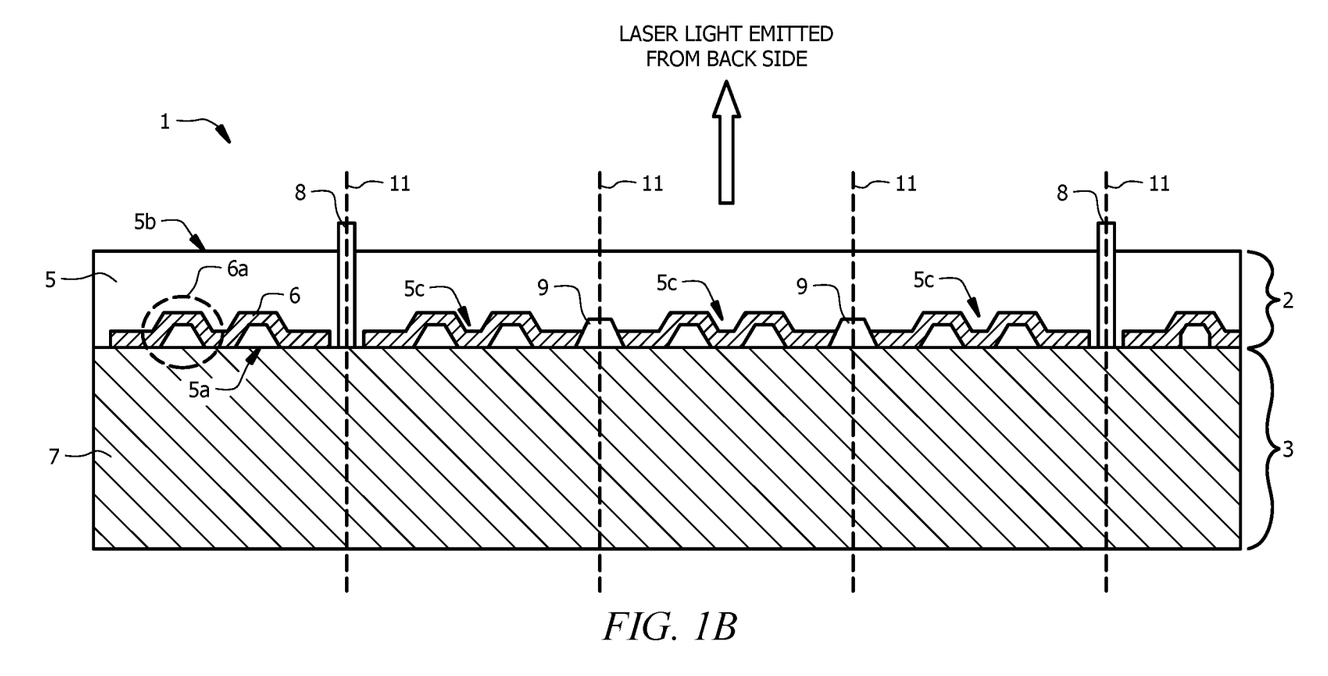
FIG. 1B illustrates a side cross-sectional view of the wafer-to-wafer bonded arrangement shown in FIG. 1A with the native substrate removed.
Figure 1C:
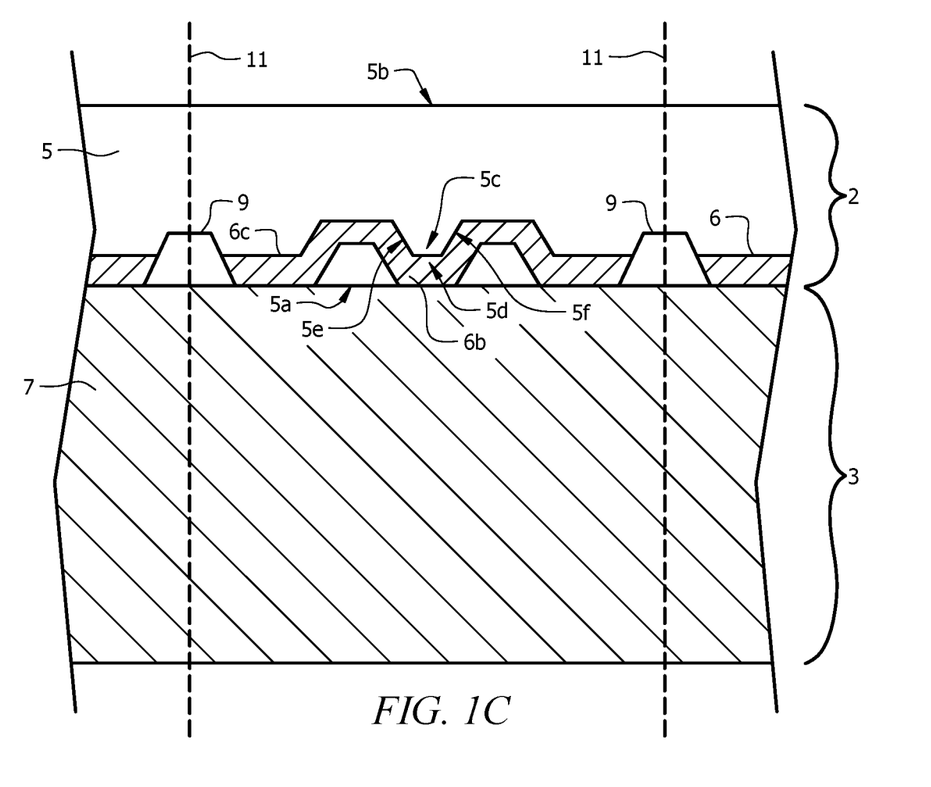
FIG. 1C illustrates an enlarged side cross-sectional view of a portion of the wafer-to-wafer bonded arrangement shown in FIG. 1B.

FIG. 1A illustrates a side cross-sectional view of a wafer-to-wafer bonded arrangement 1 comprising a back-side-emitting VCSEL wafer 2 bonded to an HTC wafer 3 in accordance with an illustrative embodiment. The VCSEL wafer 2 comprises an n-type native substrate 4, an epi structure 5 and a first contact metal layer 6. The HTC wafer comprises a non-native substrate 7 and optionally a metal layer (not shown) on its top surface to facilitate bonding between the HTC wafer 3 and the VCSEL wafer 2. FIG. 1B illustrates a side cross-sectional view of the wafer-to-wafer bonded arrangement 1 shown in FIG. 1A with the native substrate 3 removed. For ease of illustration, various features of the wafer-to-wafer bonded arrangement 1 (e.g., the n-contacts of the VCSEL wafer 2) are not shown in FIGS. 1A and B. FIG. 1C illustrates an enlarged side cross-sectional view of a portion of the wafer-to-wafer bonded arrangement 1 shown in FIG. 1B. The non-native substrate 7 typically has a much higher thermal conductivity than the native substrate 4. The native substrate 4 may be made of, for example, Gallium Arsenide (GaAs) and the non-native substrate 7 may be made of, for example, Molybdenum (Mo). As indicated above, in accordance with an embodiment, the CTEs of the native and non-native substrates 4 and 7 are closely matched to prevent warping and reduce interfacial stress after the wafer bonding process has been performed, which, as indicated above, can lead to bonding failure in some cases.

In general, the materials that are used for the native and non-native substrates 4 and 7 will have CTEs that are as close to one another as possible and the material that is used for the non-native substrate 7 will have a thermal conductivity that is as high as possible. However, because of limitations on choices of available materials, tradeoffs may have to be made between achieving both of these goals. In the example given above in which GaAs is used for the native substrate 4 and Mo is used for the non-native substrate 7, the thermal conductivities are 0.55 Watts per centimeter per degree Celsius (W/cm/deg-C) and 1.32 W/cm/deg-C, respectively, and the CTEs are 5.73 parts per million (ppm)/deg-C and 4.9 ppm/deg-C, respectively. It was found through experimentation that these values provided suitable results. It should be noted, however, that the invention is not limited to using these materials. Persons of skill in the art will understand, in view of the description provided herein, the manner in which suitable materials may be chosen for the native and non-native substrates 4 and 7 that allow one or more of the aforementioned objectives of dissipating heat and/or reducing the likelihood of bond failure to be achieved. The materials that are used for this purpose should also be relatively easy to work with and not too expensive. In the case where GaAs or a material having similar characteristics is used for the native substrate 4, examples of other materials that may be used for the non-native substrate 7 include tungsten (W) and aluminum nitride (AlN), both of which have relatively high thermal conductivities and CTEs that are close to that of GaAs.

The epi structure 5, in accordance with one illustrative embodiment, includes a first DBR on a first side 5a of the epi structure 5 that is adjacent to the non-native substrate 7 and includes a second DBR on a second side 5b of the epi structure 5 that is adjacent to the native substrate 4. The epi structure 5 includes a multi-quantum well (MQW) region sandwiched in between the first and second DBRs. The first and second DBRs are of first and second electrical conductivity types that are different from one another. The term "electrical conductivity type," as that term is used herein, means either n-type or p-type. If the first DBR is a p-type DBR, then the second DBR is an n-type DBR, and vice versa. In accordance with the illustrative embodiments described herein, the first DBR on the first side 5a of the epi structure 5 is a p-type DBR and the second DBR on the second side 5b of the epi structure is an n-type DBR. It should be noted, however, that the electrical conductivity types of the first and second DBRs can be switched such that the n-type DBR is on the first side 5a of the epi structure 5 and the p-type DBR is on the second side 5b of the epi structure 5. For ease of illustration, the n- and p-type DBRs and the MQW region are not explicitly shown in FIGS. 1A and 1B.

The first side 5a of the epi structure 5 having the first contact metal layer 6 thereon is the front side of the wafer-to-wafer bonded arrangement 1. In accordance with this illustrative embodiment, the first contact metal layer 6 is the p-contact metal layer since it is in contact with the p-type DBR. For ease of discussion, the first and second DBRs are referred to herein as the p-type and n-type DBRs, respectively, and the contact metal layer 6 is referred to as the p-contact metal layer 6 to be consistent with the illustrative, or exemplary, embodiment. In cases where the native substrate 4 is removed after wafer bonding, the second side 5b of the epi structure 5 is the back side of the wafer-to-wafer bonded arrangement 1. In cases where the native substrate 4 is not removed, the side 4a of the native substrate 4 is the back side of the wafer-to-wafer bonded arrangement 1. For illustrative purposes, it will be assumed that the entire native substrate 4 is removed, as shown in FIG. 1B, such that the second side 5b of the epi structure 5 is the back side of the wafer-to-wafer bonded arrangement 1.

In accordance with an illustrative embodiment, first and second sets of trenches 8 and 9, respectively, are formed in the VCSEL wafer 2 prior to performing the wafer-to-wafer bonding operation. Each of the sets of trenches 8 and 9 has at least one trench and typically has more than one trench. The trenches 8 are typically provided at many locations throughout the VCSEL wafer 2. The trenches 9 are typically provided about the periphery of each VCSEL die. In FIGS. 1A and 1B, a single VCSEL die is identified as being in between dashed lines 11. Each VCSEL die has at least one VCSEL and may include an array comprising multiple VCSELs. The trenches 8 and 9 typically have different shapes, sizes and depths and serve different purposes, although the trenches 8 and 9 may serve multiple purposes and may overlap in purpose. The trenches 8 extend the entire way through the p-contact metal layer 6 and through the epi structure 5. The trenches 8 typically extend a short distance into the native substrate 4. The trenches 9 extend through the p-contact metal layer 6 and into the epi structure 5. The trenches 9 are typically wider than and shallower than the trenches 8.

With reference to FIG. 1B, because laser light produced by the VCSELs of the VCSEL wafer 2 passes out of the back side 5b rather than the front side 5a of the VCSEL wafer 2, some or all of the native substrate 4 is typically removed to prevent laser light directed toward the back side 5b from being absorbed by the native substrate 4. With front-side-emitting VCSELs, the common method for forming elements or structures on the back side of the VCSEL wafer relies on imaging both sides and superimposing the images to determine alignment of features on the front and back sides. Because the front side 5a of the VCSEL wafer 2 is bonded to the HTC wafer 3, which presumably is not transparent for imaging purposes, the common method of imaging both sides and superimposing the images cannot be used. For example, Mo is not transparent for imaging purposes. The trenches 8 provide features that are visible from the back side 5b of the VCSEL wafer 2 so that the process of aligning the front and back sides 5a and 5b, respectively, can be performed using images captured solely of the back side 5b of the VCSEL wafer 2.

Features of the VCSEL wafer 2 other than the trenches 8 may also be used as alignment features that are viewable by an imaging system from the back side 5b. For example, the portion of the p-contact metal layer inside of dashed circle 6a in FIG. 1B may be visible from the back side 5b by using infrared (IR) imaging technology. The manner in which IR imaging technology may be used in semiconductor processing technology to locate features in a wafer and use them for alignment purposes is known, and therefore will not be further described herein in the interest of brevity.

The trenches 9 reduce the likelihood that bonding failure will occur. Because wafer-to-wafer bonding does not occur at the interface between the trenches 9 and the HTC wafer 3, particulates trapped in these areas will have no effect on bond integrity. Consequently, the trenches 9 reduce the likelihood that trapped particulates at the interface between the wafers 2 and 3 will result in a bonding failure. In addition, the trenches 9 provide strain relief from stress on the bond that may be caused by a mismatch between the CTEs of the native and non-native substrates 4 and 7, respectively. Providing this strain relief reduces the likelihood that a bonding failure will occur. As indicated above, the CTEs of the native and non-native substrates 4 and 7, respectively, will typically be closely matched, but in the event that the CTEs are not very closely matched, the strain relief provided by the trenches 9 helps prevent bonding failure from occurring. By eliminating the requirement of using materials for the native and non-native substrates 4 and 7 that have CTEs that are very closely matched, the trenches 9 provide additional freedom for selecting the materials that are used for the native and non-native substrates 4 and 7.

It can be seen in FIGS. 1A-1C that the p-contact metal layer 6 is non-planar in shape. This is due to a mesa 5c that is formed in the p-type DBR of the epi structure 5 of each VCSEL die. The mesas 5c are shown inverted in FIGS. 1A-1C due to the VCSEL wafer 2 being flipped front-side down onto the HTC wafer 3. Illustrative embodiments of processes that may be used to form the mesas 5c are described below in detail. With reference to FIG. 1C, each mesa 5c has a flat top 5d and sloped sides 5e and 5f. The portion 6b of the p-contact metal layer 6 that covers the flat top 5d is at the same level as portion 6c of the p-contact metal layer 6. The portion 6c provides a larger bonding surface for a robust bond. It also provides support for wire bonding on the n-contact metal disposed on the back surface of the VCSEL die when the die is singulated. As will be described below in more detail, the mesas 5c provide deeper implantation for current isolation and improved refractive index light guiding.

Figure 2:
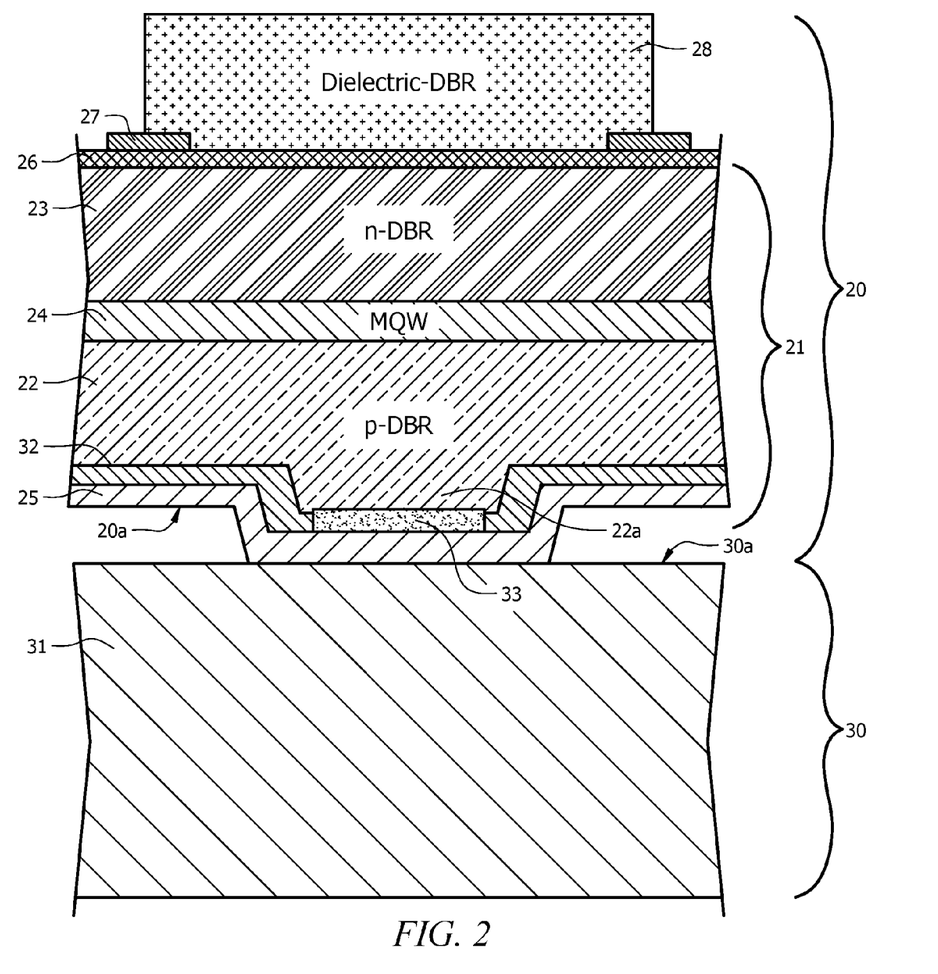
FIG. 2 illustrates a cross-sectional view of a portion of a back-side-emitting VCSEL wafer bonded to a non-native substrate of an HTC wafer in accordance with an illustrative embodiment.

FIG. 2 illustrates a cross-sectional view of a portion of a back-side-emitting VCSEL wafer 20 bonded to a non-native substrate 31 of an HTC wafer 30 in accordance with an illustrative embodiment. The wafer 20 has no native substrate because the native substrate was removed after performing wafer-to-wafer bonding. The epi structure 21 of the VCSEL wafer 20 includes a first DBR 22, a second DBR 23, and an MQW region 24 disposed in between the DBRs 22 and 23. In accordance with this illustrative embodiment, the first and second DBRs 22 and 23, respectively, are p-type and n-type DBRs, respectively, although the first and second DBRs 22 and 23 could instead by n-type and p-type DBRs, respectively. The first DBR 22 has the mesa 22a formed in it of the type described above with reference to FIGS. 1A-1C. A layer of dielectric material 32, such as, for example, silicon nitride (SiN) is disposed on the front side of the VCSEL wafer 20 and patterned to leave openings in it that are slightly smaller than the width of the mesa 22a. The same mask that is used for patterning the layer of dielectric material 32 is then used as a mask for depositing a layer of fill metal 33 over the layer of dielectric material so that the fill metal fills the openings in the patterned dielectric layer 32. The thickness of metal layer 33 is the same or slightly greater than the thickness of the dielectric layer 32.

A contact metal layer 25, which is a p-contact metal layer in this illustrative embodiment, is disposed on the front side 20a of the VCSEL wafer 20 and is bonded to a top surface 30a of the non-native substrate 31. Disposing the metal fill layer 33 in the openings of the dielectric layer 32 prevents voids from being created in the contact metal layer 25, which is helpful for bonding purposes. For bonding purposes, the top surface 30a of the non-native substrate 31 is typically covered with an optional metal layer (not shown). Typical metal layers that could be used for this purpose include, for example, 500 angstrom of titanium and one micrometer of gold. A current spreading layer (CSL) 26 is disposed on a top surface of the second DBR 23. A metal contact 27 with an opening (window), which in this illustrative embodiment is the n-metal contact, is disposed on top of the CSL 26. A dielectric DBR 28, which is optional, is disposed on top of the CSL 26 and on top of portions of the metal contact 27.

In accordance with this illustrative embodiment, the non-native substrate 30 is made of Mo. The native substrate (not shown), which has been removed in this illustrative embodiment, may be made of GaAs, for example. Mo has very high thermal conductivity and is mechanically very sturdy, which makes it a highly suitable material for use as the non-native substrate, although other materials are also suitable for this purpose, as will be understood by persons of skill in the art in view of the description being provided herein. The invention is not limited in regard to the materials that may be used for the substrates and for the various layers, provided that the materials that are used meet the requirements set forth herein and are suitable for their described purposes. Persons of skill in the art will understand how appropriate materials may be selected for use in the VCSEL and HTC wafers 20 and 30.

An illustrative embodiment of a process that may be used to process the front side 20a of the VCSEL wafer 20 shown in FIG. 2 will now be described with reference to FIGS. 3A-3D. For ease of illustration, the native substrate of the VCSEL wafer 20 is not shown, although it would typically not be removed until after the front-side processes have been performed and the wafers 20 and 30 have been bonded together. For ease of discussion and illustration, some processing steps, such as those that are routinely performed in semiconductor processing, have been omitted.

Figure 3A:
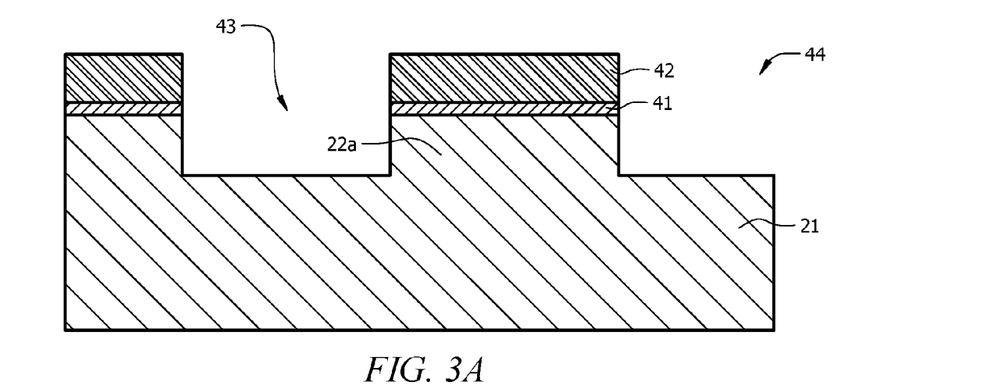
FIGS. 3A-3D illustrate processing steps of a process in accordance with an illustrative embodiment that may be used to process the front-side of the VCSEL wafer shown in FIG. 2.

With reference to FIG. 3A, a thin layer of dielectric material (e.g., SiN) 41 is deposited on the upper surface of the EPI structure 21 and subjected to rapid thermal annealing (RTA). A first photoresist mask 42 is deposited over the dielectric material layer 41 and windows 43 and 44 are etched into the EPI structure 21 to form the mesa 22a. During this etching process, the trenches 9 (FIGS. 1A and 1B), which are not visible in FIG. 3A, are etched about the peripheries of the VCSEL dies.

Figure 3B:
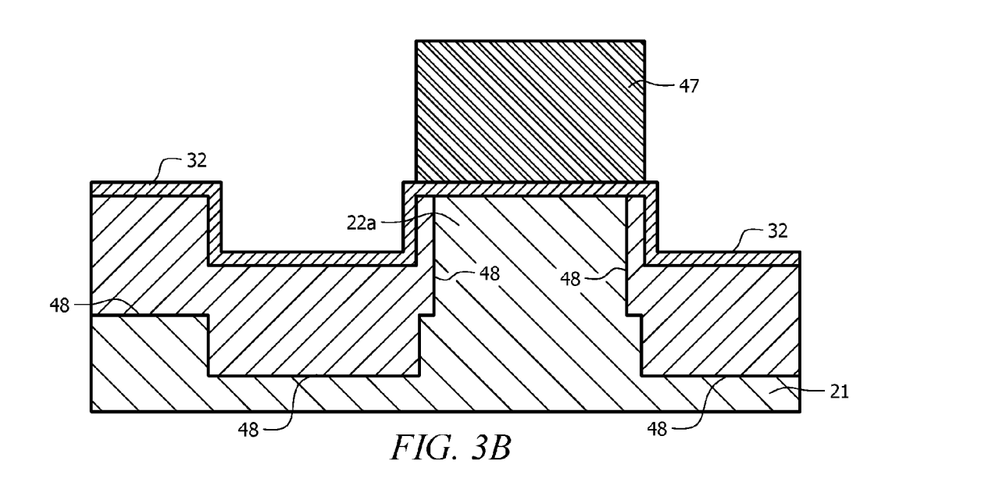

With reference to FIG. 3B, the photoresist mask 42 and the dielectric material layer 41 shown in FIG. 3A have been removed and another layer of dielectric material layer 32 (FIG. 2) has been redeposited on the epi structure 21. A second photoresist mask 47 is deposited on the epi structure 21 above the mesa 22a. A proton implantation process is then performed. Photoresist mask 47 is thick enough to impede the protons from reaching the epi layer underneath it. In the unmasked regions of the epi structure 21 that are not covered by photoresist mask 47, the hydrogen protons (H+) penetrate the epi structure 21. The lines 48 represent the depths and widths of the implanted areas of the epi structure 21.

Figure 3C:
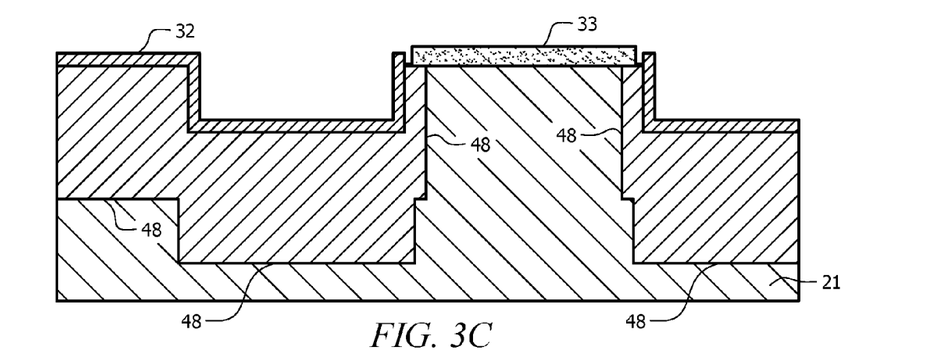

With reference to FIG. 3C, the second photoresist mask 47 is stripped away and a third photoresist mask (not shown) is deposited and patterned to leave the surface of the epi structure 21 above the mesa 22a unmasked. The portion of the dielectric material layer 32 that is above the mesa 22a is then stripped away. A metal fill layer 33 (FIG. 2) is deposited on the wafer through evaporation. As indicated above, the same mask that was used to pattern the dielectric material layer 32 may be used to deposit the metal fill layer 33. The metal layer 33 may comprise, for example, platinum and gold (PtAu). The third photoresist mask and the metal deposited on it are then stripped away, leaving the structure as shown in FIG. 3C.

Figure 3D:
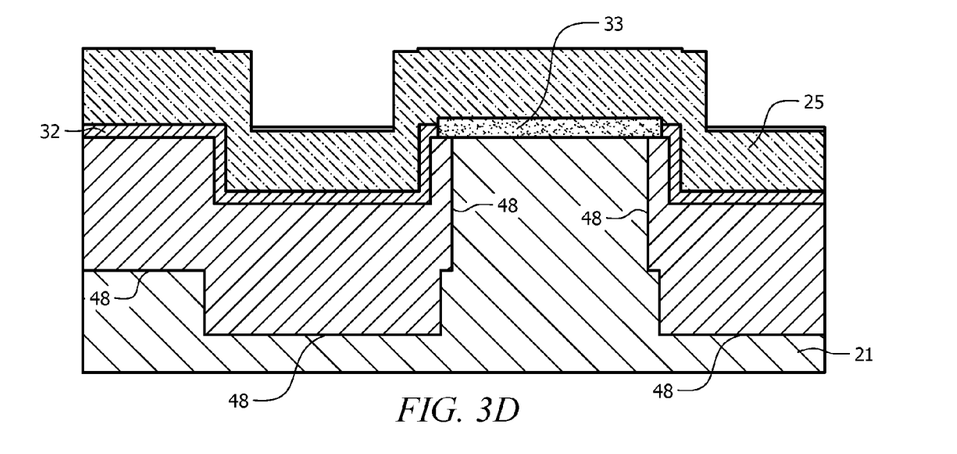

With reference to FIG. 3D, a fourth photoresist mask (not shown) is deposited that masks areas where scribe alleys (not shown) will subsequently be formed in the epi structure 21 about the dicing boundaries of the VCSEL dies. The contact metal layer 25 (FIG. 2) comprising, for example, TiAu is deposited over the unmasked dielectric and metal layers 32 and 33, respectively. The fourth photoresist mask is then stripped away.

After the metal layer 25 has been deposited, a fifth photoresist mask (not shown) that mask locations at which the trenches 8 (FIGS. 1A and 1B) that will be used for alignment purposes will be formed. An etching process is then performed to etch the trenches 8 through the epi structure 21. Care is taken during these masking and etching process steps to ensure that the trenches 8 do not interfere with the lithography of the epi structure 21. The fifth photoresist mask is then stripped away.

After the processing steps described above with reference to FIGS. 3A-3D have been performed, the VCSEL wafer 20 is bonded with the HTC wafer 30. Prior to the bonding process being performed, a metal layer (not shown), such as a layer of Au, for example, is deposited on the bonding surface of the non-native substrate 31 (FIG. 2) by a process such as sputtering or evaporation, for example. A metal-to-metal thermal compression bonding process is then performed to bond side 20a (FIG. 2) of the VCSEL wafer 20 to side 30a (FIG. 2) of the HTC wafer 30. Metal-to-metal thermal compression processes that are used for wafer-to-wafer bonding are known in the art and therefore will not be described in detail herein in the interest of brevity.

After the wafer-to-wafer bonding process has been performed, the back-side processing of the VCSEL wafer 20 is performed. As indicated above, the trenches 8 (FIGS. 1A and 1B) that were formed during the front-side processing steps described above with reference to FIGS. 3A-3D may be used to align the front-side and back-side of the VCSEL die 20 in order to perform the back-side processing steps. Because many of the back-side processing steps are steps that are routinely performed in VCSEL wafer processing, they are not shown in the figures for ease of illustration and in the interest of brevity.

The first step in the back-side processing is to thin or remove the native substrate of the VCSEL wafer 20. As indicated above, the entirety of the native substrate may be removed. Alternatively, a portion of the native substrate may be removed. Known processes such as grinding, polishing and/or etching may be used to remove all or a portion of the native substrate. After the native substrate has been partially or wholly removed, ion (H+) implantation is performed from the back side with the area of the light-emitting window and the n-contact area protected. The n-contact pads 27 (FIG. 2) are then formed on top of the current spreading layer 26 (FIG. 2). An anti-reflection (AR) coating (not shown) is then formed over the n-contact pads 27 and the current spreading layer 26. Windows or openings are formed in the AR coating that reveal the n-contact pads 27 to allow for connecting bond wires to the n-contact pads 27. The windows or openings can be formed either by etching the AR coating or as a result of a lift off process during the AR coating deposition process.

In embodiments where the dielectric DBR 28 (FIG. 2) is included, the dielectric DBR 28 is deposited and windows for the n-contact pads 27 and for the scribe alleys are formed in the dielectric DBR 28. Similar to the AR coating, the window/opening of the DBR can be formed by etching the DBR after deposition or as a result of a lift off process during the deposition of the DBR.] The scribe alleys are then etched down to the metal bonding layer of the HTC wafer 30 to clear away portions of the epi structure 21 prior to dicing the wafer-to-wafer bonded arrangement into individual back-side emitting VCSEL dies.

It should be noted that the invention has been described with reference to illustrative embodiments and that the invention is not limited to these embodiments. Those skilled in the art will understand the manner in which modifications can be made to the illustrative embodiments and that all such modifications are within the scope of the invention. For example, while FIGS. 1A-3D show particular combinations of layers, more layers or fewer layers than what is shown in FIGS. 1A-3D may be included. Similarly, while FIGS. 3A-3D depict certain processing steps, other processing steps not described above or shown may be performed in fabricating the wafer-to-wafer bonded arrangement.

What is claimed is:

1. A wafer-to-wafer bonded arrangement comprising:
    a highly thermally-conductive (HTC) wafer, the HTC wafer comprising a non-native substrate; and
    a vertical cavity surface emitting laser (VCSEL) wafer having a front side and a back side, the VCSEL wafer comprising:
        an epitaxial (epi) structure having a first side and a second side, the epi structure comprising a first distributed Bragg reflector (DBR) adjacent the first side of the epi structure, a second DBR adjacent the second side of the epi structure, and one or more layers comprising a quantum well (QW) region disposed in between the first DBR and the second DBR, the first DBR having a first electrical conductivity type and the second DBR having a second electrical conductivity type that is different from the first electrical conductivity type; and
        a first contact metal layer disposed on the front side of the VCSEL wafer and in contact with the first DBR, the first contact metal layer being bonded to a top surface of the HTC wafer, wherein the VCSEL wafer has a plurality of first trenches formed therein that pass through the first contact metal layer, through the first side of the epi structure and extend a distance into the epi structure without passing through the epi structure to the second side of the epi structure.

2. The wafer-to-wafer bonded arrangement of claim 1, wherein the VCSEL wafer further comprises:
    a native substrate having a top surface and a bottom surface, the bottom surface of the native substrate being adjacent the second side of the epi structure, the non-native substrate being made of a material that has a higher thermal conductivity than a thermal conductivity of a material of which the native substrate is made.

3. The wafer-to-wafer bonded arrangement of claim 2, wherein the materials of which the native and non-native substrates are made have coefficients of thermal expansion (CTEs) that are closely matched.

4. The wafer-to-wafer bonded arrangement of claim 2, wherein the materials of which the native and non-native substrates are made have coefficients of thermal expansion (CTEs) that differ by less than 3 parts per million per degree Celsius.

5. The wafer-to-wafer bonded arrangement of claim 2, wherein the material of which the non-native substrate is made is Molybdenum.

6. The wafer-to-wafer bonded arrangement of claim 2, wherein the material of which the non-native substrate is made comprises multiple layers of different materials.

7. The wafer-to-wafer bonded arrangement of claim 2, wherein the material of which the native substrate is made is Gallium Arsenide (GaAs).

8. The wafer-to-wafer bonded arrangement of claim 1, wherein the VCSEL wafer comprises a plurality of VCSEL dies, and wherein each VCSEL die has one of the first trenches formed therein about a periphery of the respective VCSEL die.

9. The wafer-to-wafer bonded arrangement of claim 1, wherein the VCSEL wafer was fabricated to include a native substrate that was subsequently removed after the bonding of the first contact metal layer to the top surface of the HTC wafer, the non-native substrate being made of a material that has a higher thermal conductivity than a thermal conductivity of a material of which the native substrate is made.

10. The wafer-to-wafer bonded arrangement of claim 9, wherein the material of which the non-native substrate is made is Molybdenum.

11. The wafer-to-wafer bonded arrangement of claim 9, wherein the material of which the non-native substrate is made comprises multiple layers of different materials.

12. The wafer-to-wafer bonded arrangement of claim 9, wherein the material of which the native substrate is made is Gallium Arsenide (GaAs).

13. The wafer-to-wafer bonded arrangement of claim 9, wherein the materials of which the native and non-native substrates are made have coefficients of thermal expansion (CTEs) that are closely matched.

14. The wafer-to-wafer bonded arrangement of claim 9, wherein the materials of which the native and non-native substrates are made have coefficients of thermal expansion (CTEs) that differ by less than 3 parts per million per degree Celsius.

15. The wafer-to-wafer bonded arrangement of claim 9, wherein the VCSEL wafer comprises a plurality of VCSEL dies, and wherein each of the first trenches is formed about a periphery of a respective VCSEL die.

16. The wafer-to-wafer bonded arrangement of claim 15, wherein the VCSEL wafer has at least one second trench formed therein, each second trench passing through the first contact metal layer and through the epi structure such that the second trench is viewable by an imaging device from the back side of the VCSEL wafer.

17. The wafer-to-wafer bonded arrangement of claim 16, wherein the VCSEL wafer has a plurality of the second trenches formed therein.

18. The wafer-to-wafer bonded arrangement of claim 1, wherein the VCSEL wafer comprises a plurality of VCSEL dies, wherein the epi structure and the first contact metal layer extend through all of the VCSEL dies, and wherein the first DBR of each VCSEL has a non-planar mesa structure formed therein, each mesa structure including sloped side walls and a generally flat top, the flat top of each mesa structure being in contact with the first contact metal layer.

19. The wafer-to-wafer bonded arrangement of claim 18, wherein each VCSEL die comprises at least one VCSEL.

20. The wafer-to-wafer bonded arrangement of claim 19, wherein each VCSEL die comprises an array of VCSELs.

21. The wafer-to-wafer bonded arrangement of claim 1, wherein the bond is a thermal compression bond.

22. The wafer-to-wafer bonded arrangement of claim 1, wherein the non-native substrate is made of a material that is electrically conductive.

23. A back-side-emitting vertical cavity surface emitting laser (VCSEL) chip comprising:
a highly thermally-conductive (HTC) substrate; and
a vertical cavity surface emitting laser (VCSEL) die having a front side and a back side, the VCSEL die comprising:
an epitaxial (epi) structure having a first side and a second side, the epi structure comprising a first distributed Bragg reflector (DBR) adjacent the first side of the epi structure, a second DBR adjacent the second side of the epi structure, and one or more layers comprising a quantum well (QW) region disposed in between the first DBR and the second DBR, the first DBR having a first electrical conductivity type and the second DBR having a second electrical conductivity type that is different from the first electrical conductivity type; and
a first contact metal layer disposed on the front side of the VCSEL die and in contact with the first DBR, the first contact metal layer being bonded to a top surface of the HTC substrate or to a metal layer disposed on the top surface of the HTC substrate, wherein laser light produced by the VCSEL die is emitted from the VCSEL chip through the back side of the VCSEL die, wherein the VCSEL die has a first trench formed about a periphery thereof, the first trench passing through the first contact metal layer, through the first side of the epi structure and extending a distance into the epi structure without passing through the epi structure to the second side of the epi structure.

24. The back-side-emitting VCSEL chip of claim 23, wherein the VCSEL chip further comprises:
a native substrate having a top surface and a bottom surface, the bottom surface of the native substrate being adjacent the first side of the epi structure, the HTC substrate being made of a material that has a higher thermal conductivity than a thermal conductivity of a material of which the native substrate is made.

25. The back-side-emitting VCSEL chip of claim 24, wherein the materials of which the native and HTC substrates are made have coefficients of thermal expansion (CTEs) that are closely matched.

26. The back-side-emitting VCSEL chip of claim 23, wherein the VCSEL die was diced from a wafer-to-wafer bonded arrangement that included a VCSEL wafer bonded to an HTC wafer, and wherein the VCSEL wafer was fabricated to include a native substrate that was subsequently removed prior to the first contact metal layer being bonded to the top surface of the HTC substrate, the HTC substrate being made of a material that has a higher thermal conductivity than a thermal conductivity of a material of which the native substrate is made.

27. The back-side-emitting VCSEL chip of claim 26, wherein the materials of which the native and HTC substrates are made have coefficients of thermal expansion (CTEs) that are closely matched.

28. The back-side-emitting VCSEL chip of claim 23, wherein the VCSEL die has at least one second trench formed therein, each second trench passing through the first contact metal layer and through the epi structure.

29. The back-side-emitting VCSEL chip of claim 23, wherein the first DBR of the VCSEL die has a non-planar mesa structure formed therein, the mesa structure including sloped side walls and a generally flat top, the flat top of the mesa structure being in contact with the first contact metal layer.

30. The back-side-emitting VCSEL chip of claim 29, wherein the VCSEL die comprises at least one VCSEL.

31. The back-side-emitting VCSEL chip of claim 23, wherein the VCSEL die comprises an array of VCSELs.

32. The back-side-emitting VCSEL chip of claim 23, wherein the bond is a thermal compression bond.

33. The back-side-emitting VCSEL chip of claim 23, wherein the HTC substrate is made of a material that is electrically conductive.

34. The back-side emitting VCSEL chip of claim 23, wherein the material of which the non-native substrate is made comprises multiple layers of different materials.

35. A back-side-emitting vertical cavity surface emitting laser (VCSEL) chip comprising:
 a highly thermally-conductive (HTC) substrate; and
 a vertical cavity surface emitting laser (VCSEL) die having a front side and a back side, the VCSEL die comprising:
  an epitaxial (epi) structure having a first side and a second side, the epi structure comprising a first distributed Bragg reflector (DBR) adjacent the first side of the epi structure, a second DBR adjacent the second side of the epi structure, and one or more layers comprising a quantum well (QW) region disposed in between the first DBR and the second DBR, the first DBR having a first electrical conductivity type and the second DBR having a second electrical conductivity type that is different from the first electrical conductivity type, the first DBR having a non-planar mesa structure formed therein, the mesa structure including sloped side walls and a generally flat top;
  a patterned layer of dielectric material disposed on the first DBR, the patterned layer of dielectric material having respective openings formed therein over the respective mesas;
  a metal fill layer disposed in the openings formed in the patterned layer of dielectric material in contact with the flat top of the mesa structure, the metal fill layer having a thickness that is the same as or slightly greater than a thickness of the patterned layer of dielectric material; and
  a first contact metal layer disposed on the front side of the VCSEL die and in contact with the patterned layer of dielectric material and with the metal fill layer, the first contact metal layer being bonded to a top surface of the HTC substrate or to a metal layer disposed on the top surface of the HTC substrate, wherein laser light produced by the VCSEL die is emitted from the VCSEL chip through the back side of the VCSEL die.

* * * * *